US011598811B2

(12) United States Patent
Ruan et al.

(10) Patent No.: US 11,598,811 B2
(45) Date of Patent: Mar. 7, 2023

(54) METHOD, APPARATUS, AND COMPUTER STORAGE MEDIUM FOR IDENTIFYING CELL

(71) Applicant: Contemporary Amperex Technology Co., Limited, Ningde (CN)

(72) Inventors: Jian Ruan, Ningde (CN); Mingshu Du, Ningde (CN); Shichao Li, Ningde (CN); Shenzhi Tang, Ningde (CN); Yanhua Lu, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/745,921

(22) Filed: May 17, 2022

(65) Prior Publication Data
US 2022/0276310 A1    Sep. 1, 2022

Related U.S. Application Data

(63) Continuation of application No. PCT/CN2021/093691, filed on May 13, 2021.

(30) Foreign Application Priority Data

Jul. 13, 2020 (CN) .......................... 202010667411.1

(51) Int. Cl.
*G01R 31/36* (2020.01)
*G01R 31/396* (2019.01)
*G01R 31/388* (2019.01)

(52) U.S. Cl.
CPC ..... *G01R 31/3646* (2019.01); *G01R 31/3648* (2013.01); *G01R 31/388* (2019.01); *G01R 31/396* (2019.01)

(58) Field of Classification Search
CPC ............ G01R 31/3646; G01R 31/3648; G01R 31/388; G01R 31/396; G01R 31/3842;
(Continued)

(56) References Cited

U.S. PATENT DOCUMENTS

| 4,280,097 A | * | 7/1981 | Carey | ................. G01R 31/396 320/121 |
| 5,638,002 A | * | 6/1997 | Perelle | ................. G01R 31/396 340/636.15 |

(Continued)

FOREIGN PATENT DOCUMENTS

| CN | 101794919 A | 8/2010 |
| CN | 102088118 A | 6/2011 |

(Continued)

OTHER PUBLICATIONS

C. Y. Chun, G.-S. Seo, S. H. Yoon and B.-H. Cho, "State-of-charge estimation for lithium-ion battery pack using reconstructed open-circuit-voltage curve," 2014 International Power Electronics Conference (IPEC-Hiroshima 2014—ECCE ASIA), 2014, pp. 2272-2276, doi: 10.1109/IPEC.2014.6869906. (Year: 2014).*

(Continued)

*Primary Examiner* — M Baye Diao
(74) *Attorney, Agent, or Firm* — East IP P.C.

(57) ABSTRACT

The present disclosure discloses a method for identifying a cell, including: determining, for a cell under test during a charge and discharge process, a number N of measured values of OCV and a number N of net cumulative throughputs corresponding to the number N of measured values of OCV; for an $i^{th}$ target cell, obtaining a number N of calculated values of OCV corresponding to the number N of measured values of OCV, and obtaining an OCV mean square error between the number N of measured values of OCV and the number N of calculated values of OCV; and determining that the cell under test is the $i^{th}$ target cell, when (Continued)

the OCV mean square error between the cell under test and the $i^{th}$ target cell is a minimum mean square error among a number M of OCV mean square errors.

9 Claims, 2 Drawing Sheets

(58) Field of Classification Search
CPC ....... G01R 31/392; Y02E 60/10; G06F 17/18; G06K 9/6267
USPC .......................................................... 320/101
See application file for complete search history.

(56) References Cited

U.S. PATENT DOCUMENTS

| | | | |
|---|---|---|---|
| 8,589,097 B2 | 11/2013 | Kirchev | |
| 9,037,426 B2 * | 5/2015 | Schaefer | B60L 58/22 320/135 |
| 10,871,521 B2 * | 12/2020 | Ruan | G01R 31/367 |
| 11,108,247 B2 * | 8/2021 | Li | G01R 19/16533 |
| 11,262,406 B2 * | 3/2022 | Du | G01R 31/392 |
| 2012/0296586 A1 | 11/2012 | Kirchev | |
| 2018/0172776 A1 | 6/2018 | Ishikura | |

FOREIGN PATENT DOCUMENTS

| | | | | |
|---|---|---|---|---|
| CN | 103633384 A | | 3/2014 | |
| CN | 104859471 A | * | 8/2015 | .......... B60L 11/1862 |
| CN | 105492917 A | * | 4/2016 | ......... G01R 31/3646 |
| CN | 107117045 A | * | 9/2017 | ................ B60L 3/12 |
| CN | 206878453 U | | 1/2018 | |
| CN | 105492917 B | * | 8/2018 | ......... G01R 31/3646 |
| CN | 109731808 A | | 5/2019 | |
| CN | 107085187 B | | 6/2019 | |
| CN | 109946620 A | | 6/2019 | |
| CN | 110967645 A | | 4/2020 | |
| CN | 110967646 A | | 4/2020 | |
| CN | 110970964 A | | 4/2020 | |
| EP | 0678753 A1 | * | 10/1995 | .......... G01R 31/396 |
| EP | 2710392 B1 | * | 7/2018 | .......... B60L 11/1861 |
| JP | 3571026 B2 | * | 9/2004 | ................ B60K 6/44 |

OTHER PUBLICATIONS

The International search report for PCT Application No. PCT/CN2021/093691, dated Jul. 29, 2021, 11 pages.
The extended European search report for EP Application No. 21842722.7, dated Nov. 22, 2022, 5pages.
Notification to Grant Patent Right for Invention for Chinese Application No. 202010667411.1, dated Jun. 15, 2022, 7 pages.

* cited by examiner

METHOD, APPARATUS, AND COMPUTER STORAGE MEDIUM FOR IDENTIFYING CELL

CROSS-REFERENCES TO RELATED APPLICATIONS

The present application is a continuation of International Application No. PCT/CN2021/093691, filed on May 13, 2021, which claims the priority of the Chinese patent application 202010667411.1 entitled "METHOD, APPARATUS, AND COMPUTER STORAGE MEDIUM FOR IDENTIFYING CELL" filed on Jul. 13, 2020, and both of which are incorporated herein by reference in their entireties.

FIELD

The present application relates to the fields of battery technologies, in particular to a method, an apparatus and a computer storage medium for identifying a cell.

BACKGROUND

During the use of a battery or a cell, the state of charge (SOC) is an important index, which indicates the proportion of the electric quantity that can be provided actually in the current state to that can be provided in a fully charged state. Through this parameter, the remaining capacity of the battery in the current state can be known, and thus it is convenient for the battery management system (BMS) to issue various instructions to the battery. The OCV-SOC curve for a cell is an important reference curve for the cell, and the remaining capacity of the cell can be known by measuring the open circuit voltage (OCV).

With the rapid development and replacement of batteries such as automotive batteries, more and more batteries have entered a phrase of recycling and echelon use. In the process of the recycling and echelon use of cells, there is a situation where basic information, such as the material, architecture and OCV-SOC curve for some cells, is lost or not recorded, and for cells with such basic information lost or not recorded, it is impossible or difficult to determine information such as the type of these cells.

SUMMARY

The embodiments of the present application provide a method, an apparatus and a computer storage medium for identifying a cell.

In one aspect, an embodiment of the present application provides a method for identifying a cell, which comprises: determining, for a cell under test during a charge and discharge process, a number N of measured values of open circuit voltage (OCV) and a number N of net cumulative throughputs corresponding to the number N of measured values of OCV; obtaining, for an $i^{th}$ target cell, a number N of first state of charge (SOC) values corresponding to the number N of measured values of OCV, according to the number N of measured values of OCV and a first correspondence between an open circuit voltage and a SOC for the $i^{th}$ target cell; determining a second correspondence between the net cumulative throughputs and the states of charge for the $i^{th}$ target cell, according to the number N of net cumulative throughputs and the number N of first SOC values; obtaining, for the $i^{th}$ target cell, a number N of second SOC values corresponding to the number N of net cumulative throughputs, according to the number N of net cumulative throughputs and the second correspondence; obtaining, for the $i^{th}$ target cell, a number N of calculated values of OCV corresponding to the number N of second SOC values, according to the number N of second SOC values and the first correspondence; obtaining an OCV mean square error between the cell under test and the $i^{th}$ target cell, based on the number N of measured values of OCV and the number N of calculated values of OCV; determining that the cell under test is the $i^{th}$ target cell, when the OCV mean square error between the cell under test and the $i^{th}$ target cell is a minimum mean square error among a number M of OCV mean square errors, wherein M represents a total number of target cells, $1 \leq i \leq M$, and both M and N are positive integers greater than 1.

As an example, the determining, for a cell under test during a charge and discharge process, a number N of measured values of open circuit voltage (OCV) and a number N of net cumulative throughputs corresponding to the number N of measured values of OCV comprises: determining the number N of measured values of OCV and the number N of net cumulative throughputs, according to historical charge and discharge data for the cell under test or test data obtained by intermittently charging and discharging the cell under test.

As an example, the determining a second correspondence between the net cumulative throughputs and the states of charge for the $i^{th}$ target cell, according to the number N of net cumulative throughputs and the number N of first SOC values comprises: determining an equation set regarding the first SOC values for the $i^{th}$ target cell and the net cumulative throughputs, according to the number N of net cumulative throughputs, the number N of first SOC values, and a function between the net cumulative throughputs and the states of charge; obtaining a slope and an intercept of the function, by curve fitting of the equation set based on a least square method or a gradient descent method; determining the second correspondence according to the slope, the intercept, and the function.

As an example, the obtaining, for the $i^{th}$ target cell, a number N of second SOC values corresponding to the number N of net cumulative throughputs, according to the number N of net cumulative throughputs and the second correspondence comprises: obtaining the number N of second SOC values, according to the number N of net cumulative throughputs and the function with the obtained slope and intercept.

As an example, the determining that the cell under test is the $i^{th}$ target cell, when the OCV mean square error between the cell under test and the $i^{th}$ target cell is a minimum mean square error among a number M of OCV mean square errors, specifically comprises: determining whether a preset condition is met, when the OCV mean square error between the cell under test and the $i^{th}$ target cell is the minimum mean square error among the number M of OCV mean square errors, and determining that the cell under test is the $i^{th}$ target cell when the preset condition is met; wherein the preset condition comprises a value of the OCV mean square error between the cell under test and the $i^{th}$ target cell is within a first preset threshold range; the slope of the function corresponding to the $i^{th}$ target cell is within a second preset threshold range; and the intercept of the function corresponding to the $i^{th}$ target cell is within a third preset threshold range.

As an example, after determining that the cell under test is the $i^{th}$ target cell, the method further comprises: calculating a first difference value between an initial SOC value for the cell under test and an initial SOC value for another cell within a module in which the cell under test is located; calculating a second difference value between a cell capacity for the cell under test and a cell capacity for another cell within the module in which the cell under test is located; determining that a quality of cell group is poor, when the first difference value or the second difference value exceeds a preset threshold.

As an example, the first correspondence includes an OCV-SOC curve, and after determining that the cell under test is the $i^{th}$ target cell, the method further comprises: using an OCV-SOC curve for the $i^{th}$ target cell as an OCV-SOC curve for the cell under test.

As an example, after obtaining the OCV-SOC curve for the cell under test, the method further comprises: when a difference in the OCV-SOC curve between the cell under test and other cells within a module in which the cell under test is located, is within a preset range, calculating an average OCV-SOC curve of OCV-SOC curves for the cell under test and the other cells and using the average OCV-SOC curve as an OCV-SOC curve for the module in which the cell under test is located.

In another aspect, an embodiment of the present application provides an apparatus for cell identification, which comprises: a determination unit, configured to determine, for a cell under test during a charge and discharge process, a number N of measured values of open circuit voltage (OCV) and a number N of net cumulative throughputs corresponding to the number N of measured values of OCV; a calculation unit, configured to obtain, for an $i^{th}$ target cell, a number N of first state of charge (SOC) values corresponding to the number N of measured values of OCV, according to the number N of measured values of OCV and a first correspondence between an open circuit voltage and a SOC for the $i^{th}$ target cell; determine a second correspondence between the net cumulative throughputs and the states of charge for the $i^{th}$ target cell, according to the number N of net cumulative throughputs and the number N of first SOC values; obtain, for the $i^{th}$ target cell, a number N of second SOC values corresponding to the number N of net cumulative throughputs, according to the number N of net cumulative throughputs and the second correspondence; obtain, for the $i^{th}$ target cell, a number N of calculated values of OCV corresponding to the number N of second SOC values, according to the number N of second SOC values and the first correspondence; obtain an OCV mean square error between the cell under test and the $i^{th}$ target cell, based on the number N of measured values of OCV and the number N of calculated values of OCV; and a determination unit, configured to determine that the cell under test is the $i^{th}$ target cell when the OCV mean square error between the cell under test and the $i^{th}$ target cell is a minimum mean square error among a number M of OCV mean square errors, wherein M represents a total number of target cells, $1 \le i \le M$, and both M and N are positive integers greater than 1.

In yet another aspect, an embodiment of the present application provides an a computer storage medium, having computer program instructions stored thereon, which, when executed by a processor, implement a method for identifying a cell as described above.

BRIEF DESCRIPTION OF THE DRAWINGS

In order to illustrate the technical solution of embodiments of the present application in a clearer way, the drawings required in the embodiments of the present application will be briefly introduced below. For those of ordinary skill in the art, other drawings can also be obtained according to these drawings without exercise of inventive work.

DETAILED DESCRIPTION

The features and exemplary embodiments of various aspects of the present application will be described in detail below, and in order to make the purpose, technical solutions and advantages of the present application clearer, the present application is further described in detail below, in combination with the drawings and specific embodiments. It should be understood that the specific embodiments described herein are only configured to interpret the present application, and are not configured to limit the present application. For those skilled in the art, the present application may be implemented without the need for some of these specific details. The following description of embodiments is only to provide a better understanding of the present application by showing examples of the present application.

It should be noted that, relational terms such as "first" and "second" herein are only used to distinguish one entity or operation from another entity or operation, and do not necessarily require or imply any such actual relationship or order between these entities or operations. Furthermore, terms "include", "comprise", or any other variation thereof are intended to cover non-exclusive inclusions, so that a process, method, article or device that includes a series of elements includes not only those elements, but also other elements that are not explicitly listed, or elements inherent in such process, method, article or device. In the absence of more restrictions, elements defined by the statement "include" do not preclude the existence of other identical elements in the process, method, article or device that includes the elements.

In order to solve the existing technical problems, embodiments of the present application provide a method, an apparatus, a device and a computer storage medium for identifying a cell.

For a cell under test, embodiments of the present application firstly obtain a number N of measured values of OCV for the cell under test and the net cumulative throughput for each measured value of OCV, and then obtain, for a known $i^{th}$ target cell ($1 \le i \le M$), a number N of calculated values of OCV corresponding to the number N of measured values of OCV, obtain an OCV mean square error between the number N of measured values of OCV and the number N of calculated values of OCV; and determine that the cell under test is the $i^{th}$ target cell, if the OCV mean square error between the cell under test and the $i^{th}$ target cell is a minimum mean square error among a number M of OCV mean square errors. For a cell under test with basic information lost or not recorded, the embodiments of the present application realize the technical effect of determining the type information for the cell under test.

The method for identifying a cell, that is provided by embodiments of the present application, is firstly introduced below.

Figure 1:
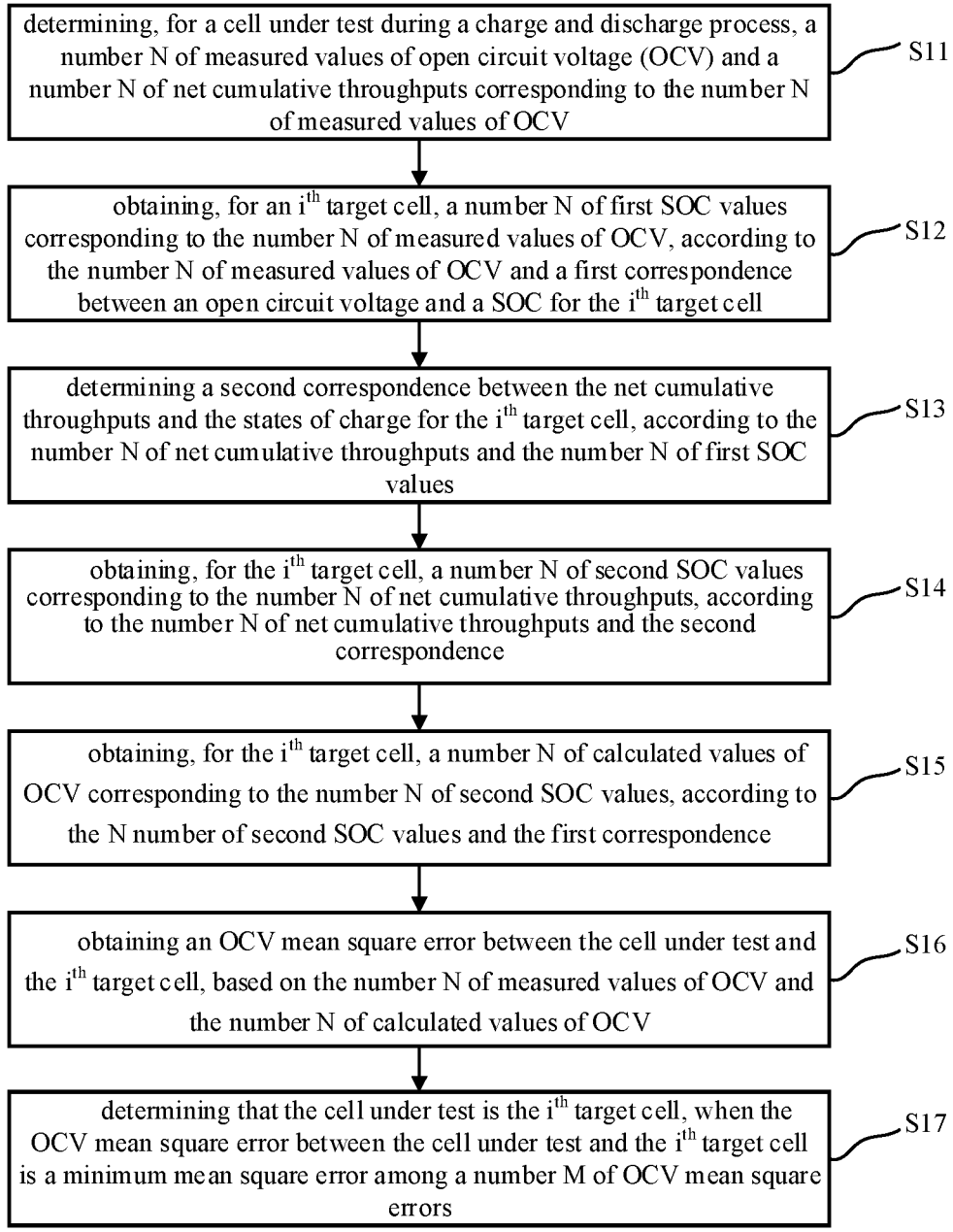
FIG. 1 shows a flow schematic diagram of a method for identifying a cell, provided by one embodiment of the present application.

FIG. 1 shows a flow schematic diagram of a method for identifying a cell, provided by one embodiment of the present application. As shown in FIG. 1, the method comprises:

Step S11: where a number N of measured values of open circuit voltage OCV and a number N of net cumulative throughputs corresponding to the number N of measured values of OCV are determined for a cell under test during the charge and discharge process;

Step S12: where a number N of first state of charge SOC values for an $i^{th}$ target cell, which correspond to the number N of measured values of OCV are obtained, according to the number N of measured values of OCV and a first correspondence between an open circuit voltage and a SOC for the $i^{th}$ target cell;

Step S13: where a second correspondence between the net cumulative throughputs and the states of charge for the $i^{th}$ target cell is determined, according to the number N of net cumulative throughputs and the number N of first SOC values;

Step S14: where a number N of second SOC values for the $i^{th}$ target cell, which correspond to the number N of net cumulative throughputs, are obtained according to the number N of net cumulative throughputs and the second correspondence;

Step S15: where a number N of calculated values of OCV for the $i^{th}$ target cell, which correspond to the number N of second SOC values, are obtained according to the number N of second SOC values and the first correspondence;

Step S16: where an OCV mean square error between the cell under test and the $i^{th}$ target cell is obtained based on the number N of measured values of OCV and the number N of calculated values of OCV;

Step S17: where it is determined that the cell under test is the $i^{th}$ target cell, when the OCV mean square error between the cell under test and the $i^{th}$ target cell is the minimum mean square error among a number M of OCV mean square errors, wherein M represents the total number of target cells, $1 \leq i \leq M$, and both M and N are positive integers greater than 1.

Specifically, for any cell under test with basic information lost or not recorded, in Step S11, a number N of measured values of open circuit voltage OCV and the net cumulative throughput corresponding to each measured value of OCV may be determined for the cell under test during the charge and discharge process by the following approaches.

As an approach, a number N of measured values of OCV and the net cumulative throughput corresponding to each measured value of OCV may be determined according to historical charge and discharge data for the cell under test. Specifically, firstly the historical charge and discharge data for the cell under test can be searched for; and if the historical charge and discharge data for the cell under test is found, then the number N of measured values of open circuit voltage OCV and a number N of net cumulative throughputs corresponding to the number N of measured values of OCV are obtained in a standing state based on an open-circuit voltage method or an OCV estimation method, according to the searched historical charge and discharge data for the cell under test.

As another approach, if there is no historical charge and discharge data for the cell under test, a number N of measured values of OCV and the net cumulative throughput corresponding to each measured value of OCV may be determined according to test data obtained by intermittently charging and discharging the cell under test. Specifically, firstly, the test data for the cell under test can be obtained by intermittently charging and discharging the cell under test, which is to be assembled into a group; next, the number N of measured values of open circuit voltage OCV and a number N of net cumulative throughputs corresponding to the number N of measured values of OCV are obtained in a standing state based on an open-circuit voltage method or an OCV estimation method, according to the test data for the cell under test.

In principle, the obtained net cumulative throughputs corresponding to the number N of measured values of OCV will increase as the corresponding measured values of OCV increase. As an example, in order to verify the accuracy of the obtained measured values of open circuit voltage OCV and the net cumulative throughputs, in step S11, after the number N of measured values of open circuit voltage OCV and the number N of net cumulative throughputs corresponding to the number N of measured values of OCV are obtained for the cell under test, a sub-step is further included, where whether the number N of measured values of open circuit voltage OCV obtained for the cell under test are positively correlated with the number N of net cumulative throughputs are determined.

If the number N of measured values of OCV are not positively correlated with the number N of net cumulative throughputs, the obtained number N of measured values of OCV and number N of net cumulative throughputs are determined to be invalid, and a number N of new measured values of open circuit voltage OCV and a number N of new net cumulative throughputs corresponding to the number N of measured values of OCV are re-determined for the cell under test.

As an example, after the number N of measured values of open circuit voltage OCV and the number N of net cumulative throughputs corresponding to the number N of measured values of OCV are determined for the cell under test, whether the number of the measured values of open circuit voltage OCV determined for the cell under test and the number of the net cumulative throughputs both reach a preset threshold is further determined, and if the number of the measured values of open circuit voltage OCV determined for the cell under test and the number of the net cumulative throughputs both reach the preset threshold, step S12 is performed, otherwise, step S11 is continued.

In step S12, a number N of first state of charge SOC values for an $i^{th}$ target cell, which correspond to the number N of measured values of OCV, are obtained according to the number N of measured values of OCV and a first correspondence between an open circuit voltage and a SOC for the $i^{th}$ target cell.

Specifically, the $i^{th}$ target cell is known, and the first correspondence between the open circuit voltage and the state of charge SOC for the $i^{th}$ target cell is also known. For example, the $i^{th}$ target cell is one of known cells stored in a database, and the first correspondence between the open circuit voltage and the state of charge SOC includes, for example, an OCV-SOC curve, but the present application is not limited in this respect.

The number N of first SOC values for the $i^{th}$ target cell, which correspond to the number N of measured values of OCV, can be obtained based on the first correspondence between the open circuit voltage and the state of charge SOC for the $i^{th}$ target cell, and the number N of measured values of OCV determined by S11.

For example, the number N of first SOC values (namely, $SOC_1$, $SOC_2$, $SOC_3$, ..., $SOC_n$, wherein $0 \leq n \leq N$) for the $i^{th}$ target cell, which correspond to the number N of measured values of OCV, can be obtained by substituting a plurality of measured values of OCV determined by step S11 (namely, $OCV_1$, $OCV_2$, $OCV_3$, ..., $OCV_n$) into the OCV-SOC curve for the $i^{th}$ target cell.

It is found that the state of charge SOC is positively proportional to the net cumulative throughput. In step S13, the expression of the function between the net cumulative throughput and the state of charge SOC for the $i^{th}$ target cell can be set as:

$$SOC_n = k*Q_n + b$$

Wherein k is the slope, which represents the reciprocal of the capacity of the cell; b is the intercept, which represents the initial state of charge; $Q_n$ represents the $n^{th}$ net cumulative throughput; and $SOC_n$ represents the $n^{th}$ first SOC value.

An equation set regarding the first SOC values for the $i^{th}$ target cell and the net cumulative throughputs is determined according to the number N of net cumulative throughputs, the number N of first SOC values, and a function between net cumulative throughputs and states of charge for the $i^{th}$ target cell. The expression of the equation set is:

$$\begin{cases} SOC_1 = kQ_1 + b \\ SOC_2 = kQ_2 + b \\ \cdots \cdots \\ SOC_n = kQ_n + b \end{cases}$$

Wherein $SOC_n$ represents the $n^{th}$ first SOC value, and $Q_n$ represents the $n^{th}$ net cumulative throughput.

After the equation set regarding the first SOC values for the $i^{th}$ target cell and the net cumulative throughputs is determined, the slope and the intercept of the function are obtained by using the least square method or the gradient descent method to perform curve fitting of the equation set described above. That is, with multiple known pairs of points $(SOC_1, Q_1)$, $(SOC_2, Q_2)$, ..., $(SOC_n, Q_n)$, a set of slope k and intercept b, which have the best fitting degree, are found through curve fitting. For example, the obtained best slope k and intercept b are k=2, b=3.

Finally, the second correspondence (e.g. $SOC_i = 2*Q_i + 3$) between the net cumulative throughputs and the states of charge for the $i^{th}$ target cell can be determined, according to the determined slope k and intercept b.

Next, in step S14, a number N of second SOC values for the $i^{th}$ target cell, which correspond to the number N of net cumulative throughputs, are obtained according to the number N of net cumulative throughputs and the second correspondence between the net cumulative throughputs and the states of charge for the $i^{th}$ target cell.

The number N of second SOC values corresponding to the number N of net cumulative throughputs are obtained according to the number N of net cumulative throughputs and the function between net cumulative throughputs and states of charge SOC for the $i^{th}$ target cell, with the obtained slope and the intercept.

Specifically, in an example where the slope k and the intercept b obtained by step S13 are k=2, b=3, the expression of the function is $SOC_i = 2*Q_i + 3$. The number N of SOC values corresponding to the number N of net cumulative throughputs can be obtained by substituting the number N of net cumulative throughputs determined by step S11 into $SOC_i = 2*Q_i + 3$. The SOC values obtained by this step are referred to as second SOC values, in order to distinguish them from the first SOC values.

Next, in step S15, a number N of calculated values of OCV for the $i^{th}$ target cell, which correspond to the number N of second SOC values, are obtained according to the number N of second SOC values and the first correspondence between the open circuit voltage and the state of charge SOC for the $i^{th}$ target cell.

In an example where the first correspondence is an OCV-SOC curve, the number N of calculated values of OCV for the $i^{th}$ target cell, which correspond to the number N of second SOC values, are obtained by substituting the number N of second SOC values into the OCV-SOC curve for the $i^{th}$ target cell.

In step S16, an OCV mean square error between the cell under test and the $i^{th}$ target cell is obtained based on the number N of measured values of OCV and the number N of calculated values of OCV determined for the $i^{th}$ target cell.

Specifically, firstly a mean square error is calculated between the number N of measured values of OCV, and the number N of calculated values of OCV determined for the $i^{th}$ target cell, and then the calculated mean square error between the number N of measured values of OCV and the number N of calculated values of OCV determined for the $i^{th}$ target cell is used as the OCV mean square error between the cell under test and the $i^{th}$ target cell.

In step S17, after the OCV mean square error between the cell under test and each of the number M of target cells is determined, a number M of OCV mean square errors are obtained totally. Whether the OCV mean square error between the cell under test and the $i^{th}$ target cell is the minimum mean square error among the number M of OCV mean square errors is determined.

It is determined that the cell under test is the $i^{th}$ target cell, when the OCV mean square error between the cell under test and the $i^{th}$ target cell is the minimum mean square error among the number M of OCV mean square errors.

As an example, whether a preset condition is met is determined when the OCV mean square error between the cell under test and the $i^{th}$ target cell is the minimum mean square error among the number M of OCV mean square errors, and it is determined that the cell under test is the $i^{th}$ target cell when the preset condition is met.

In the embodiments of the present application, the preset condition includes, for example, a value of the OCV mean square error between the cell under test and the $i^{th}$ target cell is within a first preset threshold range; the slope of the function between net cumulative throughputs and states of charge, that corresponds to the $i^{th}$ target cell, is within a second preset threshold range; and the intercept of the function between net cumulative throughputs and states of charge, that corresponds to the $i^{th}$ target cell, is within a third preset threshold range.

Thus, through the above steps, it can be determined that the cell under test is the $i^{th}$ target cell. The basic information for the cell under test, such as the cell material, cell type and cell architecture, can be determined according to the basic information for the known $i^{th}$ target cell, such as the cell material, cell type and cell architecture.

As an example, after determining that the cell under test is the $i^{th}$ target cell, the method further comprises:

using the OCV-SOC curve for the $i^{th}$ target cell as an OCV-SOC curve for the cell under test.

As an implementation, embodiments of the present application compare OCV-SOC curves for multiple cells which are grouped together, screen out abnormal cells, compare the consistency differences between the cells, and evaluate the effect of cell group.

Specifically, firstly, the OCV-SOC curve for each cell under test within the same module is determined by steps described above. And then following steps are performed:

calculating a first difference value between an initial SOC value for a cell under test and an initial SOC value for another cell within the module in which the cell under test is located;

calculating a second difference value between a cell capacity for the cell under test and a cell capacity for another cell within the module in which the cell under test is located;

determining that a quality of cell group is poor, when the first difference value or the second difference value exceeds a preset threshold.

The initial SOC value is the intercept b of the function $SOC_i=k*Q_i+b$, and the first difference value can be obtained by subtracting the intercept b of the function corresponding to this cell under test from an intercept b of a function corresponding to another cell in the module in which this cell under test is located; the cell capacity is the reciprocal of the slope k of the function $SOC_i=k*Q_i+b$, and the second difference value can be obtained by subtracting the reciprocal of the slope k of the function corresponding to this cell under test from the reciprocal of a slope k of a function corresponding to another cell in the module in which this cell under test is located.

As an implementation, when there is a difference in the OCV-SOC curve between the cell under test and other cells in a module in which the cell under test is located and the difference is within a preset range, an average OCV-SOC curve of OCV-SOC curves for the cell under test and other cells in the module, in which the cell under test is located, is calculated, and the average OCV-SOC curve is used as an OCV-SOC curve for the module in which the cell under test is located.

Figure 2:
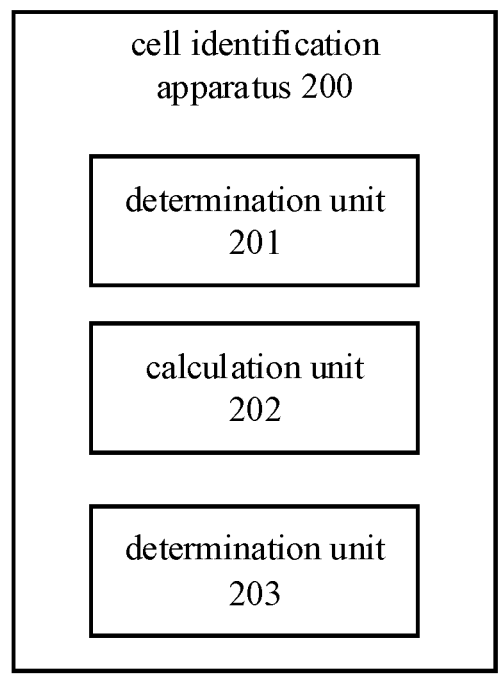
FIG. 2 is a structure schematic diagram of a cell identification apparatus provided by another embodiment of the present application.

FIG. 2 is a structure schematic diagram of a cell identification apparatus provided by another embodiment of the present application. As shown in FIG. 2, the cell identification apparatus 200 comprises:

A determination unit 201, configured to determine, for a cell under test during the charge and discharge process, a number N of measured values of open circuit voltage OCV and a number N of net cumulative throughputs corresponding to the number N of measured values of OCV;

A calculation unit 202, configured to:

obtain, for an $i^{th}$ target cell, a number N of first state of charge SOC values corresponding to the number N of measured values of OCV, according to the number N of measured values of OCV and a first correspondence between an open circuit voltage and a SOC for the $i^{th}$ target cell;

determine a second correspondence between the net cumulative throughputs and the states of charge for the $i^{th}$ target cell, according to the number N of net cumulative throughputs and the number N of first SOC values;

obtain, for the $i^{th}$ target cell, a number N of second SOC values corresponding to the number N of net cumulative throughputs, according to the number N of net cumulative throughputs and the second correspondence;

obtain, for the $i^{th}$ target cell, a number N of calculated values of OCV corresponding to the number N of second SOC values, according to the number N of second SOC values and the first correspondence;

obtain an OCV mean square error between the cell under test and the $i^{th}$ target cell, based on the number N of measured values of OCV and the number N of calculated values of OCV A determination unit 203, configured to determine that the cell under test is the $i^{th}$ target cell when the OCV mean square error between the cell under test and the $i^{th}$ target cell is a minimum mean square error among a number M of OCV mean square errors.

M represents the total number of target cells, $1 \leq i \leq M$, and both M and N are positive integers greater than 1.

Figure 3:
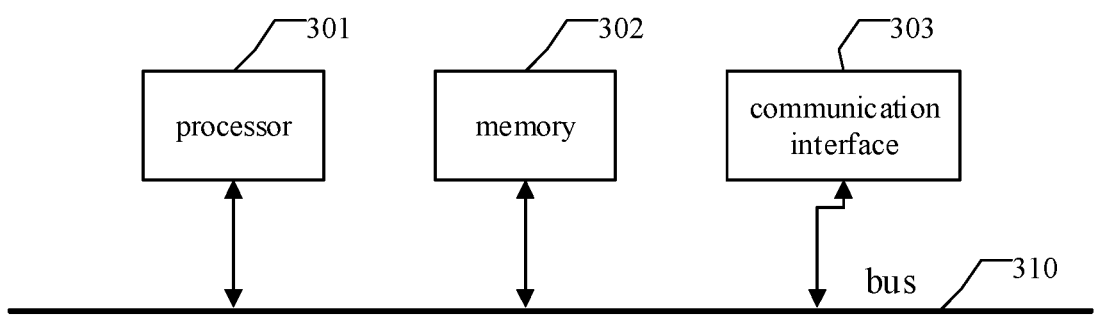
FIG. 3 is a structure schematic diagram of a cell identification device provided by yet another embodiment of the present application.

FIG. 3 shows a hardware structure schematic diagram of a cell identification device provided by yet another embodiment of the present application. As shown in FIG. 3, the cell identification device may comprise a processor 301 and a memory 302 storing computer program instructions.

Specifically, this processor 301 may include a central processing unit (CPU) or an Application Specific Integrated Circuit (ASIC), or may be configured as one or more integrated circuits to implement embodiments of the present application.

The memory 302 may include a mass memory for data or instructions. For example, the memory 302 may include, but not limited to, a hard disk drive (HDD), floppy disk drive, flash memory, optical disc, magneto-optical disc, magnetic tape or universal serial bus (USB) drive or a combination of two or more of the foregoing. As appropriate, the memory 302 may include a removable or non-removable (or fixed) medium. As appropriate, the memory 302 may be internal or external to the cell identification device. In a particular embodiment, the memory 302 is a non-volatile solid state memory. In a particular embodiment, the memory 302 includes a read-only memory (ROM). As appropriate, the ROM may be a mask-programmed ROM, programmable ROM (PROM), erasable PROM (EPROM), electrically erasable PROM (EEPROM), electrically alterable ROM (EAROM) or flash memory, or a combination of two or more of the foregoing.

The processor 301 implements any of the above embodiments of the method for identifying a cell, by reading and executing the computer program instructions stored in the memory 302.

In one example, the cell identification device may further include a communication interface 303 and a bus 310. As shown in FIG. 3, the processor 301, the memory 302 and the communication interface 303 are connected and communicate with each other through the bus 310.

The communication interface 303 is mainly used for the communication between various modules, apparatuses, units and/or devices in embodiments of the present application.

The bus 310 includes hardware, software, or both, to couple components of an online data traffic charging device to each other. For example, the bus may include, but not limited to, an accelerated graphics port (AGP) or other graphics buses, enhanced industrial standard architecture (EISA) bus, front side bus (FSB), Hyper Transport (HT) interconnection, industrial standard architecture (ISA) bus, infinite bandwidth interconnection, low pin count (LPC) bus, memory bus, micro channel architecture (MCA) bus, peripheral component interconnect (PCI) bus, PCI-Express (PCI-X) bus, Serial Advanced Technology Attachment (SATA) bus, Video Electronics Standards Association Local (VLB) bus or other suitable buses or combination of two or more of the foregoing. As appropriate, the bus 310 may include one or more buses. Although particular buses are described and illustrated in the embodiment of the present application, any suitable bus or interconnection is considered by the present application.

Accordingly, an embodiment of the present application provides a computer storage medium having computer program instructions stored thereon, which, when executed by a processor, implement any of the methods for identifying the cell in the embodiments described above.

In summary, the method, apparatus and computer storage medium of embodiments of the present application, for a cell under test, firstly obtain a number N of measured values of OCV for the cell under test and the net cumulative throughput for each measured value of OCV, and then obtain, for the known $i^{th}$ target cell (1≤i≤M), a number N of calculated values of OCV corresponding to the number N of measured values of OCV, and obtain an OCV mean square error between the number N of measured values of OCV and the number N of calculated values of OCV; and determine that the cell under test is the $i^{th}$ target cell, when the OCV mean square error between the cell under test and the $i^{th}$ target cell is a minimum mean square error among a number M of OCV mean square errors. Thus, for a cell under test with basic information lost or not recorded, the present application realizes the technical effect of determining the type information for the cell under test.

In addition, embodiments of the present application further realizes the technical effect of evaluating the effect of cell group by comparing OCV-SOC curves for multiple cells which are grouped together, screening out abnormal cells, and comparing the consistency differences between the cells.

It should be understood that the present application is not limited to the specific configuration and processing described above and shown in the figures. For the sake of brevity, a detailed description of known methods is omitted here. In the above embodiments, several specific steps are described and shown as examples. However, the methodological process of the present application is not limited to the specific steps described and shown, and those skilled in the art, after understanding the spirit of the present application, may make various changes, modifications and additions, or change the order of the steps.

It should be understood that function blocks shown in the above structure block diagrams can be implemented as a hardware, a software, a firmware or a combination thereof. When implemented in hardware, the function blocks may be, for example, electronic circuits, application-specific integrated circuits (ASIC), appropriate firmwares, plug-ins, function cards, and the like. When implemented in software, the elements of the present application are programs or code segments used to perform the required tasks. The programs or code segments may be stored in a machine-readable medium or transmitted over a transmission medium or communication link through a data signal carried in the carrier wave. The "machine-readable medium" can include any medium that is able to store or transmit information. Examples of the machine-readable medium include electronic circuits, semiconductor memory devices, ROM, flash memory, erasable ROM (EROM), floppy disks, CD-ROM, optical discs, hard disks, optical fiber media, radio frequency (RF) links, and so on. The code segments can be downloaded via computer networks such as the Internet, intranet, etc.

It should also be noted that, the exemplary embodiments mentioned in the present application describe some methods or systems based on a series of steps or apparatuses. However, the present application is not limited to the order of the steps described above, that is, the steps may be performed in an order different from the order in the embodiment, or several steps may be performed simultaneously.

The embodiments above are merely specific implementations of the present application, and those skilled in the relevant art will clearly understand that the specific work processes of the system, module, and unit described above, which are not repeated for the purpose of the convenience and conciseness of the description, can be learned with the reference to the corresponding processes in the method embodiments described above. It should be understood that the scope of the present application is not limited to the specific implementations, and within the scope disclosed by the present application, any of those skilled in the art can conceive various equivalent modifications or replacements, which fall within the scope of the present application.

What is claimed is:

1. A method for identifying a cell under test, comprising:
    determining, for the cell under test during a charge and discharge process, a number N of measured values of open circuit voltage (OCV) and a number N of net cumulative throughputs corresponding to the number N of measured values of OCV, based on searched historical charge and discharge data for the cell under test or test data obtained by intermittently charging and discharging the cell under test;
    obtaining, for an $i^{th}$ target cell, a number N of first state of charge (SOC) values corresponding to the number N of measured values of OCV, according to the number N of measured values of OCV and a first correspondence between an open circuit voltage and a SOC for the $i^{th}$ target cell;
    determining a second correspondence between the net cumulative throughputs and the states of charge for the $i^{th}$ target cell, according to the number N of net cumulative throughputs and the number N of first SOC values;
    obtaining, for the $i^{th}$ target cell, a number N of second SOC values corresponding to the number N of net cumulative throughputs, according to the number N of net cumulative throughputs and the second correspondence;
    obtaining, for the $i^{th}$ target cell, a number N of calculated values of OCV corresponding to the number N of second SOC values, according to the number N of second SOC values and the first correspondence;
    obtaining an OCV mean square error between the cell under test and the $i^{th}$ target cell, based on the number N of measured values of OCV and the number N of calculated values of OCV;
    identifying the cell under test as the $i^{th}$ target cell, when the OCV mean square error between the cell under test and the $i^{th}$ target cell is a minimum mean square error among a number M of OCV mean square errors,
    wherein M represents a total number of target cells, 1≤i≤M, and both M and N are positive integers greater than 1.

2. The method according to claim 1, wherein the determining a second correspondence between the net cumulative throughputs and the states of charge for the $i^{th}$ target cell, according to the number N of net cumulative throughputs and the number N of first SOC values comprises:
    determining an equation set regarding the first SOC values for the $i^{th}$ target cell and the net cumulative throughputs, according to the number N of net cumulative throughputs, the number N of first SOC values, and a function between the net cumulative throughputs and the states of charge;
    obtaining a slope and an intercept of the function, by curve fitting of the equation set based on a least square method or a gradient descent method;
    determining the second correspondence according to the slope, the intercept, and the function.

3. The method according to claim 2, wherein the obtaining, for the $i^{th}$ target cell, a number N of second SOC values corresponding to the number N of net cumulative throughputs, according to the number N of net cumulative throughputs and the second correspondence comprises:

obtaining the number N of second SOC values, according to the number N of net cumulative throughputs and the function with the obtained slope and intercept.

4. The method according to claim 2, wherein, the determining that the cell under test is the $i^{th}$ target cell, when the OCV mean square error between the cell under test and the $i^{th}$ target cell is a minimum mean square error among a number M of OCV mean square errors, specifically comprises:
determining whether a preset condition is met, when the OCV mean square error between the cell under test and the $i^{th}$ target cell is the minimum mean square error among the number M of OCV mean square errors, and
determining that the cell under test is the $i^{th}$ target cell when the preset condition is met;
wherein the preset condition comprises:
a value of the OCV mean square error between the cell under test and the $i^{th}$ target cell is within a first preset threshold range;
the slope of the function corresponding to the $i^{th}$ target cell is within a second preset threshold range; and
the intercept of the function corresponding to the $i^{th}$ target cell is within a third preset threshold range.

5. The method according to claim 1, wherein, after determining that the cell under test is the $i^{th}$ target cell, the method further comprises:
calculating a first difference value between an initial SOC value for the cell under test and an initial SOC value for another cell within a module in which the cell under test is located;
calculating a second difference value between a cell capacity for the cell under test and a cell capacity for another cell within the module in which the cell under test is located;
determining that a quality of cell group is poor, when the first difference value or the second difference value exceeds a preset threshold.

6. The method according to claim 1, wherein the first correspondence includes an OCV-SOC curve,
after determining that the cell under test is the $i^{th}$ target cell, the method further comprises:
using an OCV-SOC curve for the $i^{th}$ target cell as an OCV-SOC curve for the cell under test.

7. The method according to claim 6, wherein, after obtaining the OCV-SOC curve for the cell under test, the method further comprises:
when a difference in the OCV-SOC curve between the cell under test and other cells within a module in which the cell under test is located, is within a preset range,
calculating an average OCV-SOC curve of OCV-SOC curves for the cell under test and the other cells, and using the average OCV-SOC curve as an OCV-SOC curve for the module in which the cell under test is located.

8. A non-transitory computer storage medium, having computer program instructions stored thereon, which, when executed by a processor, implement the method for identifying a cell under test according to claim 1.

9. An apparatus for cell identification, comprising:
a determination unit, configured to determine, for a cell under test during a charge and discharge process, a number N of measured values of open circuit voltage (OCV) and a number N of net cumulative throughputs corresponding to the number N of measured values of OCV, based on searched historical charge and discharge data for the cell under test or test data obtained by intermittently charging and discharging the cell under test;
a calculation unit, configured to obtain, for an $i^{th}$ target cell, a number N of first state of charge (SOC) values corresponding to the number N of measured values of OCV, according to the number N of measured values of OCV and a first correspondence between an open circuit voltage and a SOC for the $i^{th}$ target cell; determine a second correspondence between the net cumulative throughputs and the states of charge for the $i^{th}$ target cell, according to the number N of net cumulative throughputs and the number N of first SOC values; obtain, for the $i^{th}$ target cell, a number N of second SOC values corresponding to the number N of net cumulative throughputs, according to the number N of net cumulative throughputs and the second correspondence; obtain, for the $i^{th}$ target cell, a number N of calculated values of OCV corresponding to the number N of second SOC values, according to the number N of second SOC values and the first correspondence; obtain an OCV mean square error between the cell under test and the $i^{th}$ target cell, based on the number N of measured values of OCV and the number N of calculated values of OCV;
an identification unit, configured to identify the cell under test as the $i^{th}$ target cell when the OCV mean square error between the cell under test and the $i^{th}$ target cell is a minimum mean square error among a number M of OCV mean square errors,
wherein M represents a total number of target cells, $1 \leq i \leq M$, and both M and N are positive integers greater than 1.

* * * * *